(12) United States Patent
Ha

(10) Patent No.: US 10,211,270 B2
(45) Date of Patent: Feb. 19, 2019

(54) THIN FILM TRANSISTOR AND DISPLAY PANEL USING THE SAME HAVING SERIALLY CONNECTED GATES

(71) Applicant: LG Display Co., Ltd., Seoul (KR)

(72) Inventor: JongMoo Ha, Paju-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 15/825,039

(22) Filed: Nov. 28, 2017

(65) Prior Publication Data
US 2018/0151650 A1 May 31, 2018

(30) Foreign Application Priority Data

Nov. 30, 2016 (KR) .................. 10-2016-0161502

(51) Int. Cl.
| | |
|---|---|
| *H01L 51/00* | (2006.01) |
| *H01L 27/32* | (2006.01) |
| *G09G 3/32* | (2016.01) |
| *G09G 3/36* | (2006.01) |
| *G09G 3/3233* | (2016.01) |
| *G09G 3/3291* | (2016.01) |

(52) U.S. Cl.
CPC ....... *H01L 27/3248* (2013.01); *G09G 3/3233* (2013.01); *G09G 3/3291* (2013.01); *G09G 3/3685* (2013.01); *H01L 27/3262* (2013.01); *H01L 27/3279* (2013.01); *H01L 27/3204* (2013.01); *H01L 51/0097* (2013.01); *H01L 2227/323* (2013.01); *H01L 2251/5338* (2013.01)

(58) Field of Classification Search
CPC ............. H01L 51/0097; H01L 27/3204; H01L 27/3248; H01L 27/3262; H01L 27/3279; H01L 2251/5338; G09G 3/3233; G09G 3/3291; G09G 3/3685
See application file for complete search history.

(56) References Cited

U.S. PATENT DOCUMENTS

| | | | | | |
|---|---|---|---|---|---|
| 5,550,701 | A | * | 8/1996 | Nadd | H01L 27/0248 257/355 |
| 5,702,963 | A | * | 12/1997 | Vu | A61B 3/113 438/197 |
| 6,075,271 | A | * | 6/2000 | Smith | H01L 27/0266 257/355 |
| 6,713,779 | B2 | * | 3/2004 | Tezuka | H01L 21/84 257/19 |
| 6,784,041 | B2 | * | 8/2004 | Takeuchi | H01L 27/115 257/239 |
| 6,841,827 | B2 | * | 1/2005 | Koga | H01L 27/112 257/347 |
| 7,018,889 | B2 | * | 3/2006 | Porter | G11C 11/412 257/E27.099 |

(Continued)

*Primary Examiner* — Ida M Soward
(74) *Attorney, Agent, or Firm* — Polsinelli PC

(57) ABSTRACT

Provided is a display panel to which a dual gate transistor is applied. The display panel includes a substrate including a pixel area and a non-pixel area and a dual gate transistor disposed on the non-pixel area. The dual gate transistor includes first and second transistors which are connected in series and an auxiliary electrode which connects two gate electrodes of the first and second transistors. The auxiliary electrode is on a layer which is different from the gate electrode. Therefore, an area in which the dual gate transistor is formed is reduced and stability of the driving circuit is secured.

20 Claims, 10 Drawing Sheets

(56) References Cited

U.S. PATENT DOCUMENTS

| | | | | |
|---|---|---|---|---|
| 7,518,512 | B2* | 4/2009 | Ganz | G06K 19/0701 |
| | | | | 257/369 |
| 8,049,559 | B2* | 11/2011 | Kaido | H01L 29/7839 |
| | | | | 330/148 |
| 8,330,159 | B2* | 12/2012 | Large | H01L 22/22 |
| | | | | 257/48 |
| 9,349,719 | B2* | 5/2016 | Chen | H01L 29/78642 |
| 9,978,778 | B2* | 5/2018 | Shi | H01L 27/124 |
| 2005/0199905 | A1* | 9/2005 | Komachi | H01L 29/0634 |
| | | | | 257/141 |
| 2005/0264175 | A1* | 12/2005 | Yamazaki | H01L 21/3226 |
| | | | | 313/500 |
| 2010/0019313 | A1* | 1/2010 | Kerber | H01L 21/823412 |
| | | | | 257/327 |
| 2014/0264628 | A1* | 9/2014 | Lin | H01L 27/0808 |
| | | | | 257/401 |
| 2016/0204084 | A1* | 7/2016 | Lin | H01L 23/481 |
| | | | | 438/107 |
| 2017/0256569 | A1* | 9/2017 | Ohara | H01L 21/02164 |

* cited by examiner

THIN FILM TRANSISTOR AND DISPLAY PANEL USING THE SAME HAVING SERIALLY CONNECTED GATES

CROSS-REFERENCE TO RELATED APPLICATION

This application claims the priority of Korean Patent Application No. 10-2016-0161502 filed on Nov. 30, 2016, in the Korean Intellectual Property Office, the disclosure of which is incorporated herein by reference in its entirety.

BACKGROUND

Field of the Disclosure

The present disclosure related to a display device and more particularly, to a thin film transistor and a display panel using the same and more in detail, to a thin film transistor having a dual gate structure for implementing a high resolution and a narrow bezel.

Description of the Background

As it enters the information era, a display device field which visually displays an electrical information signal is rapidly developing. The display device is used to watch, enjoy, and share not only simple images, but also various contents such as texts, pictures, and videos. Therefore, studies for increasing a resolution of a display device have been continuing to implement a screen as if a user watches an actual object through various display devices. And, studies for eliminating an unnecessary area other than an area for displaying a screen are ongoing in order to implement a thin and light display device which can be used anytime and anywhere. That is, these are studies for implementing a display device which reduces a border area enclosing an area for displaying a screen. Such a display device is called as a narrow bezel display device. Representative examples of the display device to which the narrow bezel is applied include a liquid crystal display device (LCD), a plasma display panel device (PDP), a field emission display device (FED), an electro phoretic display device (EPD), an electro-wetting display device (EWD), and an organic light emitting display device (OLED).

The display device is divided into a display area in which a screen is displayed and a bezel area in which the screen is not displayed. In the display area, sub-pixels which represent colors are disposed and a pixel driving circuit which drives a sub-pixel is disposed in each sub-pixel. In this case, some pixel driving circuits may be shared by sub-pixels. And, driving circuits which transmit an external signal to pixels are disposed in the bezel area. Therefore, in order to implement the high resolution and reduce the bezel area, an area occupied by the circuits which drive the sub-pixels and the circuits which transmit the external signal needs to be minimized.

The above-mentioned circuits which drive the pixels and transmit signals are configured by driving elements such as a thin film transistor (TFT) and capacitors. Among these, the thin film transistor has three terminals including a gate electrode, a source electrode, and a drain electrode and an active layer (or a semiconductor layer) which forms a channel layer through which electrons or holes move. The thin film transistor is classified into P-type and N-type thin film transistors depending on a doping type of the source electrode and the drain electrode and a C-type thin film transistor formed by a combination of the P-type and the N-type transistors. And, the thin film transistors are classified into an amorphous silicon transistor (a-Si TFT), a polycrystalline silicon transistor (p-Si TFT), a single crystal transistor (c-Si TFT), and an oxide transistor (oxide TFT) depending on a type of the active layer.

And, the structure of the thin film transistor is classified into a top gate structure in which the gate electrode is disposed above the active layer, a bottom gate or inverted structure in which the gate electrode is disposed below the active layer depending on a method of disposing the gate electrode, the source electrode, the drain electrode, and the active layer. The structure of the thin film transistor may also be classified into a staggered structure in which the gate electrode and the source/drain electrode are separated up and down with respect to the active layer and a coplanar structure in which the source/drain electrode is formed to be parallel to the active layer. That is, the structure of the thin film transistor may be classified into a staggered structure (or a top-gate staggered structure), an inverted staggered structure (or a bottom-gate staggered structure), a coplanar structure (or a top-gate coplanar structure) and an inverted coplanar structure (or a bottom-gate coplanar structure). Generally, an amorphous silicon transistor may employ an inverted staggered structure and a polycrystalline silicon transistor may employ a coplanar structure.

A circuit which uses thin film transistors having the above-mentioned various structures may be applied to various display devices. Accordingly, a technique for configuring a driving circuit disposed in the display area and the bezel area in a minimum area is necessary to implement the high resolution of the display device and reduce the bezel area.

SUMMARY

A display device may be implemented using various types of display panels. The display panel is a minimum device for displaying a screen and includes sub-pixels which emits light with a red, green, blue or white wavelength or a similar wavelength and displays a screen by the combination thereof. Therefore, the display panel may include a sub-pixel, a pixel driving circuit which drives a sub-pixel and adjusts an intensity of light emitted from the sub-pixel, a gate driving circuit and a data driving circuit which transmit an external input signal to the pixel driving circuit, and a touch driving circuit for a panel which requires touch.

The pixel driving circuits are individually disposed for each sub-pixel to adjust a light emission luminance of the sub-pixel. In order to stably drive the sub-pixels, distortion of light emission luminance due to leakage current generated in the pixel driving circuit or deterioration of a device characteristic of the driving transistor needs to be suppressed. Therefore, in order to implement the stable pixel driving circuit, the pixel driving circuit becomes complicated and an area occupied by the pixel driving circuit is increased.

The pixel driving circuit is provided in the display area which displays the screen as described above, but the gate driving circuit, the data driving circuit, and the touch driving circuit are provided in the outside of the display area, that is, a non-display area (or a bezel area). The gate driving circuit, the data driving circuit or the touch driving circuit may be manufactured by driving chips to be fixed to a substrate or directly formed on the substrate. When the driving circuits are directly formed on the substrate, complex circuits such as a shift register, a level shifter, and a buffer are repeatedly disposed, to occupy a predetermined area in the non-display area.

The driving circuits are mainly constituted of transistors. When the driving circuits which inevitably occupy a predetermined physical space are disposed on the substrate, if the number of transistors is increased to improve stability of the driving circuits, a design method of disposing the transistors according to the related art has limitations in reducing the area occupied by the pixel driving circuit and reducing a width of the bezel. In detail, in order to produce a high resolution display panel with a small size, it is necessary to reduce the area occupied by the driving circuits.

Therefore, the inventors recognized the problems mentioned above and invented a method for reducing the area occupied by the transistor to increase a stability of the driving circuits disposed in the display area or the non-display area and a display panel to which the method is applied.

The present disclosure is to provide a display panel in which an area occupied by a dual gate transistor is reduced.

The present disclosure is to provide a display panel in which an area occupied by a multiple gate transistor is reduced.

The present disclosure is to provide a thin film transistor in which an area occupied by a thin film transistor with a dual gate structure is reduced by a connection structure.

The present disclosure is not limited to the above-mentioned objects, and other objects, which are not mentioned above, can be clearly understood by those skilled in the art from the following descriptions.

A display panel according to an aspect of the present disclosure includes a substrate including a pixel area and a non-pixel area and a dual gate transistor on the non-pixel area. The dual gate transistor includes first and second transistors which are connected in series and an auxiliary electrode which connects two gate electrodes of the first and second transistors. The auxiliary electrode is on a different layer from the gate electrode. Therefore, an area in which the dual gate transistor is formed may be reduced and stability of the driving circuit may be secured.

A display panel according to an aspect of the present disclosure includes a flexible substrate and a plurality of transistors on the flexible substrate. The plurality of transistors includes a multiple gate transistor in which at least two transistors are connected in series. The multiple gate transistor has a plurality of gate electrodes connected to each other through a contact hole in an insulating layer disposed on the gate electrodes. Therefores, an area in which the multiple gate transistor is formed may be reduced and stability of the driving circuit may be secured.

A thin film transistor according to another aspect of the present disclosure includes an active layer on a substrate and having two channel layers which are spaced apart from each other, a first insulating layer on the active layer, two gate electrodes which are spaced apart from each other on the first insulating layer to form a dual gate structure, and a source electrode and a drain electrode which are on the active layer with the active layer therebetween and are electrically connected to the active layer through a contact hole on the first insulating layer in which the two gate electrodes are electrically connected to each other through a connection structure disposed on a different layer from the two gate electrodes. Therefore, an area occupied by a thin film transistor having a dual gate structure may be reduced and the stability of the driving circuit may be secured.

Other detailed matters of the aspects are included in the detailed description and the drawings.

According to the aspects of the present disclosure, at least one of a dual gate transistor, a triple gate transistor, and a multiple gate transistor is disposed in a pixel driving circuit, a data driving circuit, a gate driving circuit, or a touch driving circuit, to reduce the leakage current of the transistor and secure the stability of the device.

According to the aspects of the present disclosure, an auxiliary electrode or a connection structure is applied to connect a plurality of transistors in series and the auxiliary electrode or the connection structure is disposed on a layer which is different from the gate electrode. Therefore, the area occupied by the plurality of transistors is reduced to implement a display panel with a narrow bezel.

And, according to the aspect of the present disclosure, the auxiliary electrode is formed of the same material through the same process as the drain electrode or the source electrode simultaneously. Therefore, the auxiliary electrode may be deposited without using an additional process or an additional mask.

And, according to the aspect of the present disclosure, the gate electrodes of the plurality of transistors are disposed to overlap the auxiliary electrode, so that the area occupied by the transistors may be reduced.

And, according to the aspect of the present disclosure, a plurality of transistors is formed by a polycrystalline silicon active layer with a top-gate structure, so that a performance of the transistor is improved. Further, a gate short-circuit structure is applied, to reduce an amount of the leakage current.

The objects to be achieved by the present disclosure, the means for achieving the objects, and effects of the present disclosure described above do not specify essential features of the claims, and, thus, the scope of the claims is not limited to the disclosure of the present disclosure.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
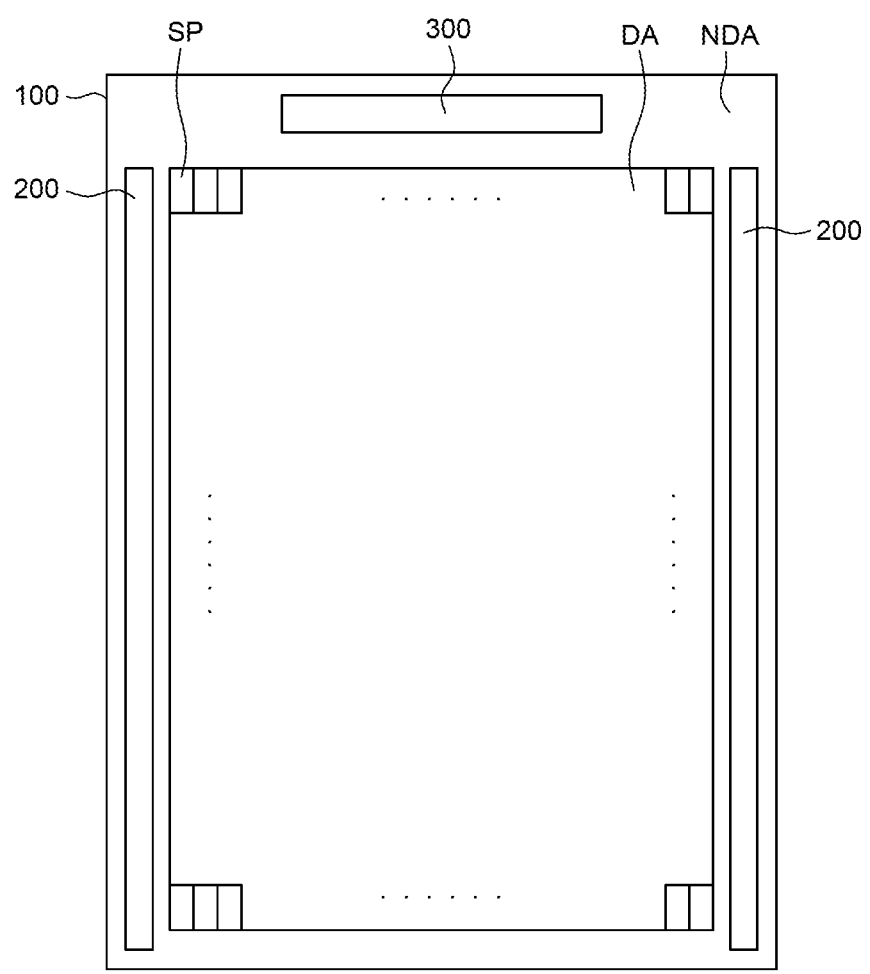
FIG. 1 is a view illustrating a transistor substrate according to the present disclosure.

Advantages and characteristics of the present disclosure and a method of achieving the advantages and characteristics will be clear by referring to aspects described below in detail together with the accompanying drawings. However, the present disclosure is not limited to aspect disclosed herein but will be implemented in various forms. The aspects are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the aspects of the present disclosure are merely examples, and the present disclosure is not limited thereto. Like reference numerals generally denote like elements throughout the specification. And, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" is not used.

When the relation of a time sequential order is described using the terms such as "after", "continuously to", "next to", and "before", the order may not be continuous unless the terms are used with the term "immediately" or "directly".

Although the terms "first", "second", and the like are used for describing various components, these components are not confined by these terms. These terms are merely used for distinguishing one component from the other components. Therefore, a first component to be mentioned below may be a second component in a technical concept of the present disclosure.

The features of various aspects of the present disclosure can be partially or entirely bonded to or combined with each other and can be interlocked and operated in technically various ways, and the aspects can be carried out independently of or in association with each other.

Hereinafter, an organic light emitting display device according to an aspect of the present disclosure will be described with reference to the accompanying drawings.

FIG. 1 is a view illustrating a transistor substrate 1000 according to an aspect of the present disclosure.

One or two or more substrates may configure a display panel used for various display devices. When two substrates configure the display panel, two substrates include a first substrate and a second substrate. The first substrate may be a transistor substrate 1000 on which a driving element driving a pixel is disposed. The second substrate may include various layers for forming a color filter substrate displaying a color of the pixel, a displaying encapsulation substrate, a cover substrate and/or a touch substrate. The first substrate and the second substrate may be a displaying panel and a cover substrate and/or a touch substrate, respectively. Alternatively, the first substrate and the second substrate may be a cover substrate and/or a touch substrate and a displaying panel, respectively.

The display panel which is formed in various forms may be applied to a display device including a TV, a mobile phone, a tablet PC, a monitor, a laptop computer, and an automotive panel. Alternatively, the display panel may be applied to a curved display device, a wearable display device, a foldable display device, a bendable display device, and a rollable display device.

Among the substrates which configure the display panel, the transistor substrate 1000 on which sub-pixels are disposed includes a substrate 100, a plurality of sub-pixels SP disposed on the substrate 100, a gate driving circuit 200, and a data driving circuit 300. The sub-pixels SP include a pixel driving circuit which drives the sub-pixels SP.

The substrate 100 is divided into a display area DA and a non-display area NDA. In the display area DA, the plurality of sub-pixels SP are disposed and light is emitted from the sub-pixels SP to represent a desired screen. The sub-pixels SP emit red light, green light, blue light, or white light. A minimum unit in which a plurality of sub-pixels SP is gathered to emit white light may be referred to as a pixel. A unit used to represent a resolution of the display panel is pixels per inch (ppi) or dots per inch (dpi), which means the number of pixels or dots included in one inch. For a high resolution display panel, a resolution of 300 ppi or higher is required. For example, one pixel may include red, green, and blue sub-pixels or include red, green, blue, and white sub-pixels. Recently, in order to increase ppi which is a resolution, two sub-pixels of red, green, and blue sub-pixels may constitute one pixel. That is, as the number of pixels which need to be included in one inch is increased, the size of the pixel is reduced. Therefore, an area occupied by the pixel driving circuit is correspondingly reduced.

The non-display area NDA is an area in which no sub-pixel is disposed. Even though the sub-pixel SP is disposed, a dummy pixel which does not emit light may be disposed. In the non-display area NDA, a gate driving circuit 200 which applies a signal to a gate line of the pixel driving circuit and a data driving circuit 300 which applies a signal to a data line of the pixel driving circuit may be disposed. And, if necessary, a touch driving circuit may be disposed. For example, the data driving circuit 300 may be manufactured as a driver-IC chip to be mounted on the substrate 100 and the gate driving circuit 200 may be formed directly on the substrate 100. When the gate driving circuit 200 is formed directly on the substrate 100, the gate driving circuit is embedded in the panel. Therefore, the gate driving circuit may be referred to as a gate in panel (GIP) circuit. When the GIP circuit is used, there is an advantage in that the number of driving chips or flexible printed circuit boards is reduced and a tap bonding process for attaching the flexible printed circuit board is omitted. Similar to the gate driving circuit 200, the touch driving circuit may be formed by using a driving chip or the flexible printed circuit board or deposited on the substrate 100 between the gate driving circuit 200 and the display area DA. However, a forming position of the touch driving circuit is not limited thereto.

The non-display area NDA is included in an area which is referred to as a bezel, in the display device. That is, the non-display area NDA and an area occupied by a set cover enclosing the display panel may be collectively referred to as a bezel. As describe above, the larger the bezel area, the less immersive the screen. And, the display device becomes thick and heavy, so that it is not easy to move or carry the display device and it is difficult to implement a design desired by a consumer. Therefore, it is necessary to reduce the bezel.

Figure 2A:
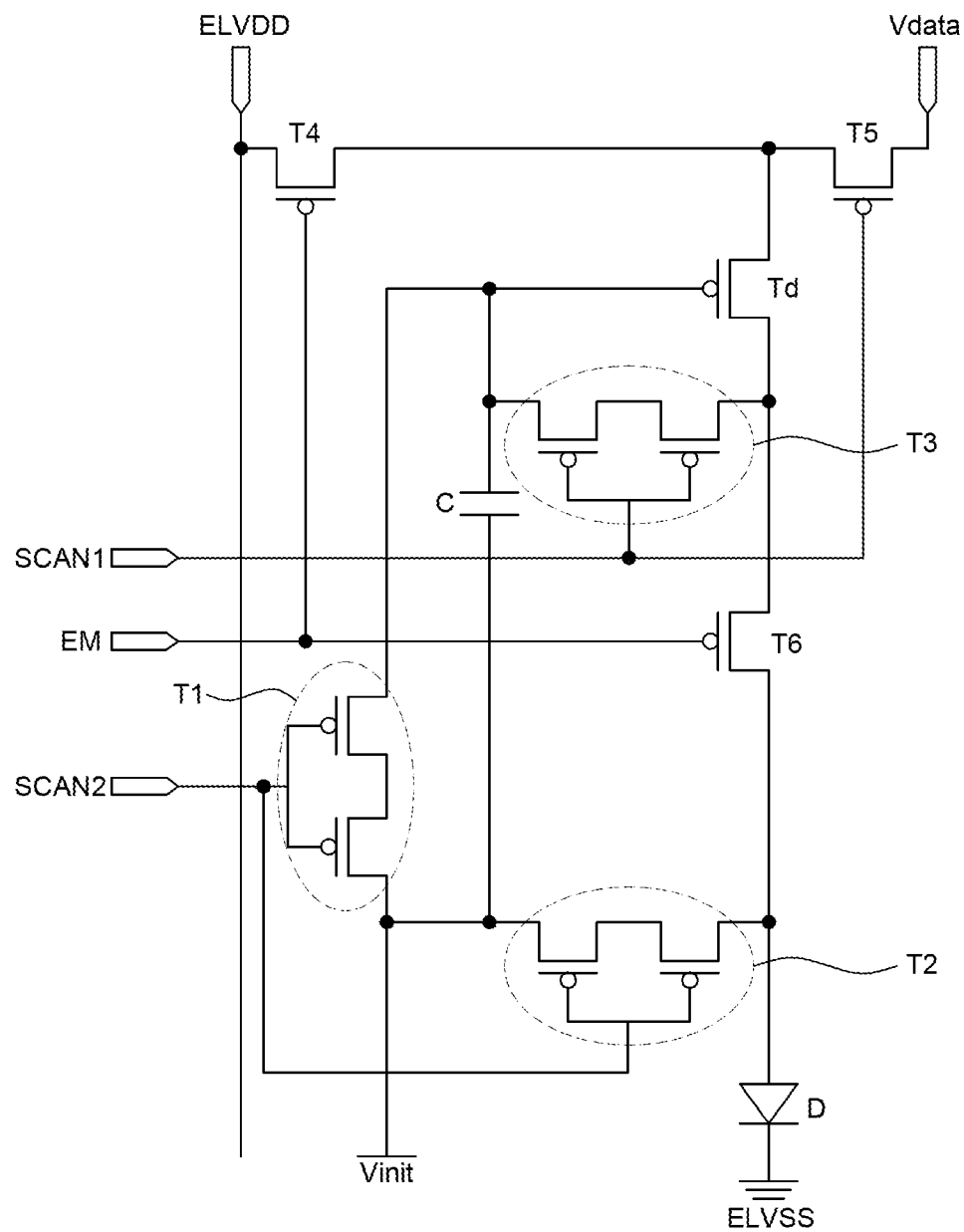
FIG. 2A is a circuit diagram of a pixel driving circuit according to a first aspect of the present disclosure, which is applied to a sub-pixel of FIG. 1.

FIG. 2A is a circuit diagram of a pixel driving circuit according to a first aspect of the present disclosure which is applied to the sub-pixel of FIG. 1. The circuit diagram is configured by a P-type transistor, but is not limited thereto.

The pixel driving circuit may include switching transistors which input a data signal and a gate signal and compensate for a threshold voltage of the driving transistor Td, in addition to the driving transistor Td and the capacitor C. For example, the pixel driving circuit may compensate for a threshold voltage of the driving transistor Td while being driven in the order of an initial period, a sampling period, and an emission period. Therefore, the pixel driving circuit may represent accurate luminance.

During the initial period, the pixel driving circuit turns on a first transistor T1 by a signal which is input to a second scan line SCAN2 so that an initial voltage Vinit initializes a gate electrode of the driving transistor Td. A second transistor T2 is turned on to fix an anode voltage of a light emitting element D to be an initial voltage Vinit, thereby increasing a sampling accuracy. In some cases, the second transistor T2 may be omitted. The initial voltage Vinit is a voltage which suppresses emission of the light emitting element D and is lower than a low potential voltage ELVSS.

During the sampling period, the gate signal is input to the first scan line SCANT to turn on a fifth transistor T5 to apply a data voltage Vdata to a source electrode of the driving transistor Td. Therefore, current flows through the driving transistor Td. And, a third transistor T3 is turned on to increase the gate voltage and the drain voltage until a difference between the gate voltage and the drain voltage of the driving transistor Td is equal to the threshold voltage of the driving transistor Td. During the sampling period, by allowing the gate voltage which is applied to the gate electrode of the driving transistor Td to include a threshold voltage value of the driving transistor Td, a driving current generated in the driving transistor Td during the emission period may be a value obtained by eliminating the threshold voltage value. That is, the threshold voltage value of the driving transistor Td is eliminated from the driving current, so that the influence of the threshold voltage value of the driving transistor Td which may change as time passes by, on the driving current may be reduced.

Next, during the emission period, a fourth transistor T4 is turned on by a signal which is input to an emission line EM to input a high potential voltage ELVDD to a source electrode of the driving transistor Td. And, a sixth transistor T6 is also turned on to generate a driving current so that the light emitting element D emits light. In this case, a sixth transistor T6 is turned off using the emission line EM during the initial period and the sampling period, so that the light emitting element D does not emit light during a period other than the emission period, so that unnecessary light emission may be suppressed.

Leakage current (off current) may be generated from a current which passes through a transistor whose source electrode or drain electrode is connected to one electrode of the capacitor in the pixel driving circuit due to a characteristic of the capacitor. Therefore, in order to suppress the influence on the leakage current as much as possible, at least two transistors which are connected to one electrode of the capacitor may be connected in series. For example, the first transistor T1, the second transistor T2, and the third transistor T3 may be constituted of dual gate transistors which operate by the same control signal and are connected to each other in series. By constituting the entire first transistor T1, the second transistor T2, and the third transistor T3 as the dual gate transistors, the influence of the leakage current can be reduced. In order to reduce the complexity of components, some of the transistors may be configured by the dual gate transistor. A dual gate transistor which will be mentioned below refers to a structure in which two transistors operate by the same control signal and are connected in series.

Figure 2B:
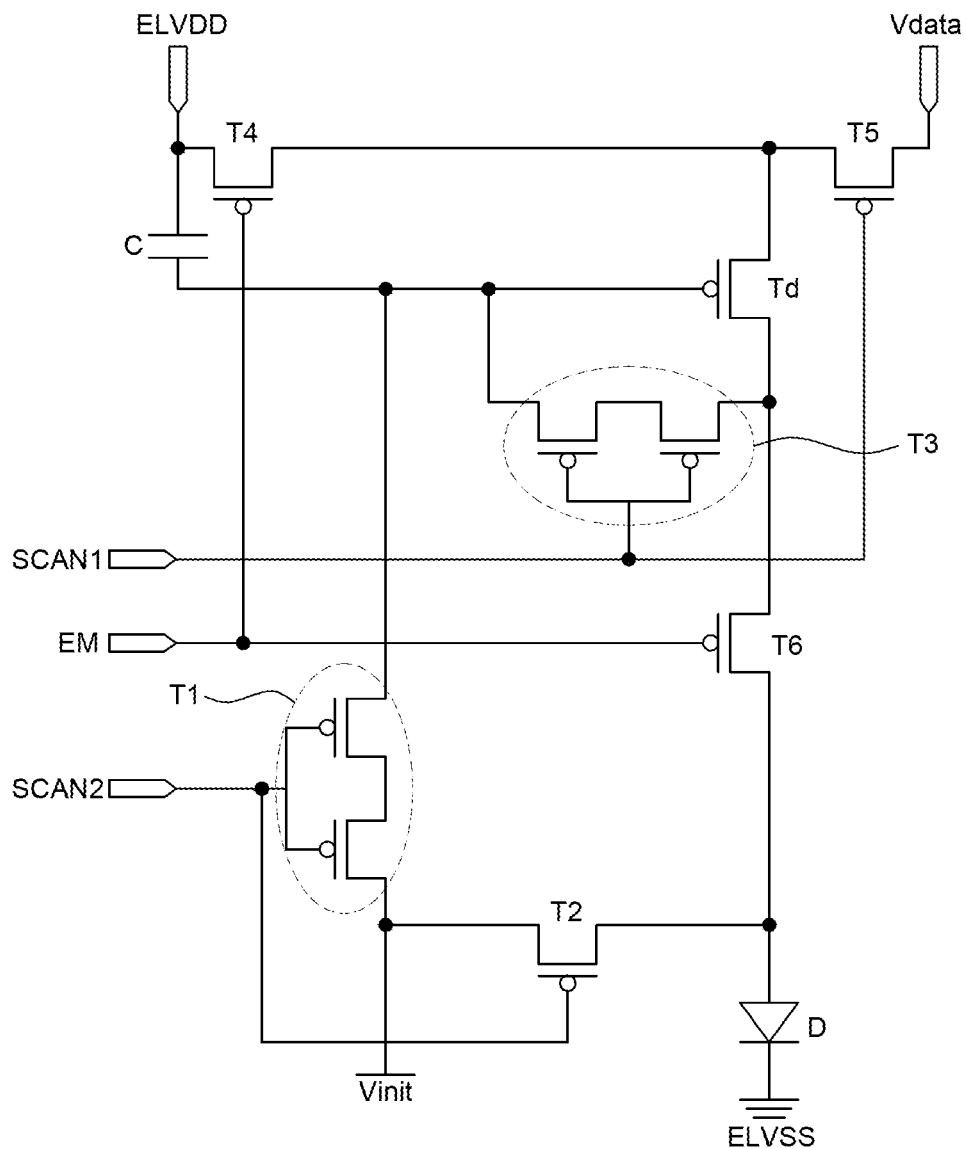
FIG. 2B is a circuit diagram of a pixel driving circuit according to a second aspect of the present disclosure, which is applied to a sub-pixel of FIG. 1.

FIG. 2B is a circuit diagram of a pixel driving circuit according to a second aspect of the present disclosure which is applied to a sub-pixel of FIG. 1 and is a modified the first aspect. Similar to the first aspect, the circuit diagram is configured by the P-type transistor, but is not limited thereto.

FIG. 2B is substantially the same pixel driving circuit as that of FIG. 2A, except that one electrode of the capacitor C is connected to the high potential voltage ELVDD in FIG. 2A. The pixel driving circuit may include switching transistors which input a data signal and a gate signal and compensate a threshold voltage of the driving transistor Td, in addition to the driving transistor Td and the capacitor C. For example, the pixel driving circuit is driven in the order to the initial period, the sampling period, and the emission period and one electrode of the capacitor C is maintained to be a high potential voltage ELVDD while being driven.

During the initial period, the pixel driving circuit turns on a first transistor T1 by a signal which is input to a second scan line SCAN2 so that an initial voltage Vinit initializes a gate electrode of the driving transistor Td. And, a second transistor T2 is turned on to fix an anode voltage of a light emitting element D, thereby increasing a sampling accuracy. In some cases, the second transistor T2 may be omitted.

During the sampling period, the gate signal is input to the first scan line SCAN1 to turn on a fifth transistor T5 to apply a data voltage Vdata to a source electrode of the driving transistor Td. Therefore, current flows through the driving transistor Td. And, a third transistor T3 is turned on to increase the gate voltage and the drain voltage until a difference between the gate voltage and the drain voltage of the driving transistor Td is equal to the threshold voltage of the driving transistor Td. During the sampling period, the voltage between the gate electrode and the drain voltage of the driving transistor Td includes a threshold voltage of the driving transistor Td, so that a driving current from which the threshold voltage of the driving transistor Td is eliminated during emission period may be generated. That is, the threshold voltage value of the driving transistor Td is eliminated from the driving current, so that the influence of the threshold voltage value of the driving transistor Td which may change as time passes by, on the driving current may be reduced.

During the emission period, a fourth transistor T4 is turned on by a signal which is input to an emission line EM to input a high potential voltage ELVDD to a source electrode of the driving transistor Td. And, a sixth transistor T6 is also turned on to generate a driving current so that the light emitting element D emits light. In this case, the sixth transistor T6 may not allow the light emitting element D to emit light during a period other than the emission period.

As mentioned above, the transistor whose source electrode or drain electrode is connected to one electrode of the capacitor may be configured to include at least two transistors which are connected in series to suppress the influence of the leakage current (off current) as much as possible. For example, the first transistor T1 and the third transistor T3 may be constituted of dual gate transistors which operate by the same control signal and are connected to each other in series. Both the first transistor T1 and the third transistor T3 constitute dual gate transistors or only some of the first transistor T1 and the third transistor T3 may be constituted of the dual gate transistor. In this case, even though the fourth transistor T4 is connected to one electrode of the capacitor, the fourth transistor T4 is connected to the high potential voltage ELVDD so that the fourth transistor is hardly affected by the leakage current due to the capacitor. Therefore, the fourth transistor may be constituted of a single transistor.

The pixel driving circuit illustrated in FIGS. 2A and 2B is an inner compensating circuit which compensates for the threshold voltage value of the driving transistor Td by switching transistors disposed in the pixel driving circuit, but is not limited thereto and may be applied to an external compensating circuit. And, in FIGS. 2A and 2B, an aspect of the dual gate transistor has been mentioned, but three or more transistors may be connected in series to reduce the leakage current generated in one electrode of the capacitor C. In this case, a structure in which two or more transistors are connected to each other in series may be referred to as a multiple gate transistor.

Next, structures of a dual gate transistor and a triple gate transistor will be described.

Figure 3A:
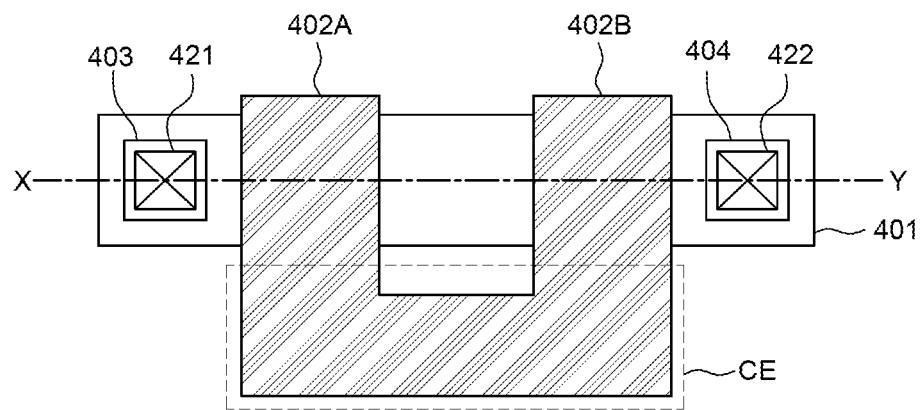
FIG. 3A is a plan view of a dual gate transistor according to a first aspect of the present disclosure.

FIG. 3A is a plan view of a dual gate transistor according to a first aspect of the present disclosure.

An active layer 401 is disposed on the substrate and two gate electrodes 402A and 402B are disposed on the active layer 401 with an insulating layer therebetween. The active layer 401 may be formed of any one of an amorphous silicon (a-Si), a polycrystalline silicon (p-Si), oxide silicon, and a single crystal silicon (c-Si). In the case of a small-size display model, it may be effective to use a polycrystalline silicon with higher electron mobility than amorphous silicon (a-Si). In the case of a large-size display model, it may be effective to use oxide silicon. Polycrystalline silicon, which has good transistor performance, is not preferred in a large display model. This is because an annealing process needs to be performed in order to make amorphous silicon into polycrystalline. And, during the annealing process, laser needs to irradiate the entire substrate so that it takes long time to perform the annealing process.

In the dual gate transistor, two transistors need to be connected in series and operate by the same gate signal. Therefore, gate electrodes required for two transistors need to be electrically connected. That is, a drain electrode of any one transistor is connected to a source electrode of the other transistor and gate electrodes of two transistors form a short structure. Therefore, an amount of current which may be leaked when one transistor is used may be reduced. In detail, in the case of an active layer 401 which uses polycrystalline silicon, as compared with an active layer which uses the amorphous silicon, leakage current is larger. Therefore, it is more effective to use the dual gate transistor.

Two gate electrodes 402A and 402B overlap the active layer 401 which is required to operate two transistors. In order to apply the same signal to two gate electrodes 402A and 402B, a connection unit CE which connects two gate electrodes 402A and 402B is disposed. The connection unit CE is disposed on the same layer as two gate electrodes 402A and 402B and electrically connects two gate electrodes 402A and 402B. In this case, shapes of two gate electrodes 402A and 402B and the connection unit CE may have an angular U shape as illustrated in FIG. 3A. However, the shapes are not limited thereto and may be a U-shape with no angles or an angular V shape. Two gate electrodes 402A and 402B and the connection unit CE may be a single layer formed of any one of molybdenum (Mo), aluminum (Al), titanium (Ti), chromium (Cr), and copper or an alloy thereof or formed of two or more materials to have double or triple layered structure.

The source electrode 403 and the drain electrode 404 are disposed on the active layer 401. The source electrode 403 and the drain electrode 404 are connected to the active layer 401 through a first contact hole 421 and a second contact hole 422, respectively. The source electrode 403 and the drain electrode 404 are disposed on both sides of two gate electrodes 402A and 402B, respectively to form a serially-connected dual gate transistor. In this case, the positions of the source electrode 403 and the drain electrode 404 may be switched. The source electrode 403 and the drain electrode 404 may be a single layer formed of any one of molybdenum (Mo), aluminum (Al), titanium (Ti), chromium (Cr), and copper (Cu), or an alloy thereof or formed of two or more materials to have double or triple layered structure.

Figure 3B:
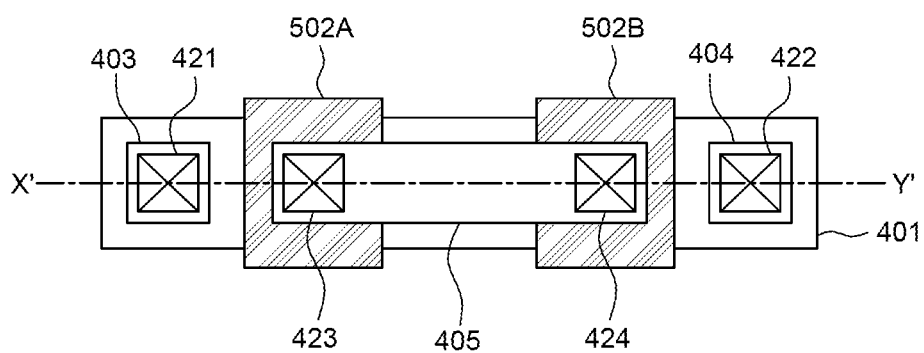
FIG. 3B is a plan view of a dual gate transistor according to a second aspect of the present disclosure.

FIG. 3B is a plan view of a dual gate transistor according to a second aspect of the disclosure. In FIG. 3B, the connection unit CE is removed from the structure of the dual gate transistor according to the first aspect of FIG. 3A and a contact hole is formed above two gate electrodes 502A and 502B to short two gate electrodes 502A and 502B.

In detail, an active layer 401 is disposed on the substrate and two gate electrodes 502A and 502B are spaced apart from each other with a predetermined interval on the active layer 401 with an insulating layer therebetween to overlap the active layer 401. In this case, a structure in which two gate electrodes 502A and 502B are disposed on the active layer 401 to be spaced apart from each other may be referred to as a dual gate structure. A third contact hole 423 and a fourth contact hole 424 are formed on two gate electrodes 502A and 502B to expose two gate electrodes 502A and 502B through the insulating layer which is disposed on two gate electrodes 502A and 502B. Simultaneously with the formation of the third contact hole 423 and the fourth contact hole 424, a first contact hole 421 and a second contact hole 422 are formed on both sides of two gate electrodes 502A and 502B, respectively to expose the active layer 401. And, a source electrode 403 and a drain electrode 404 are formed on the insulating layer to be in contact with the active layer 401 through the first contact hole 421 and the second contact hole 422. In this case, an auxiliary electrode 405 is formed such that two gate electrodes 502A and 502B are shorted from each other through the third contact hole 423 and the fourth contact hole 424. The source electrode 403, the drain electrode 404, and the auxiliary electrode 405 are simultaneously formed by the same process. The auxiliary electrode 405 may be formed in an area overlapping the active layer 401. And, the auxiliary electrode 405 may be formed of the same material as the source electrode 403 and the drain electrode 404. The auxiliary electrode 405 overlaps the active layer 401 to be disposed in the area of the active layer 401 so that an area occupied by the dual gate transistor may be reduced. In detail, the area may be reduced as much as an area occupied by the connection unit CE, so that it is effective to implement a high resolution display panel with a narrow bezel. And, as a width of the bezel is reduced, the number of substrates of a display panel which is generated from one substrate, that is, the number of chamfers is increased. Therefore, a material cost may be reduced. And, in the structure of the first aspect, only a gate line is used to connect two gate electrodes 402A and 402B. And, in the second aspect, the auxiliary electrode 405 is used so that both the gate line and a source-drain line are used and a resistance of two gate electrodes 502A and 502B is reduced. In this case, lines which are formed of the same material on the same layer to form the source electrode, the drain electrode, and the auxiliary electrode may be called the source-drain line. And, the auxiliary electrode 405 serves to electrically connect the gate electrodes to each other, so that the auxiliary electrode may be called a connection structure.

And, the materials of the active layer 401, the gate electrodes 402A, 402B, 502A, and 502B, the source electrode 403, the drain electrode 404, and the auxiliary electrode 405 which are described in the first aspect and the second aspect may be similarly applied to third to seventh aspects which will be described below. Therefore, description of the same configuration may be omitted or the same configuration may be briefly described.

Figure 3C:
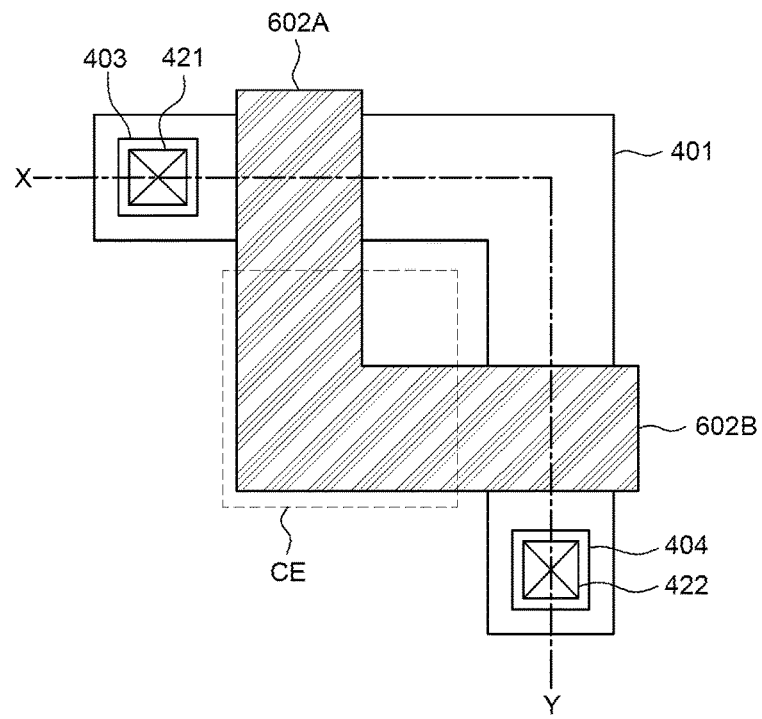
FIG. 3C is a plan view of a dual gate transistor according to a third aspect of the present disclosure.

FIG. 3C is a plan view of a dual gate transistor according to a third aspect.

An active layer 401 is disposed on a substrate and two gate electrodes 602A and 602B are disposed on the active layer 401 with an insulating layer therebetween. In this case, in the drawing, the active layer 401 has an L shape and an angle formed by two sides is 90°. However, the angle formed by two sides is not limited to 90°, but may include angles which are smaller than 180°

Two gate electrodes 602A and 602B which are disposed on the active layer 401 to implement a dual gate transistor may be divided into portions which overlap two sides of the active layer 401 to be symmetrical to the active layer 401 and a connection unit CE which connects two gate electrodes 602A and 602B overlapping two sides. The connection unit CE is formed on the same layer as two gate electrodes 602A and 602B. In this case, as illustrated in the drawing, a portion where two sides of the active layer 401 and the connection unit CE meet may have an angle, but is not limited thereto and may be rounded.

A source electrode 403 and a drain electrode 404 are disposed on the gate electrode 402 with an insulating layer therebetween and the source electrode 403 and the drain electrode 404 are connected to the active layer 401 through a first contact hole 421 and a second contact hole 422, respectively. The source electrode 403 and the drain electrode 404 are disposed on both sides of two gate electrodes 602A and 602B, respectively to form a serially-connected dual gate transistor. In this case, the positions of the source electrode 403 and the drain electrode 404 may be switched.

Therefore, a dual gate transistor structure is formed so that an amount of current which may be leaked when one transistor is used may be reduced.

Figure 3D:
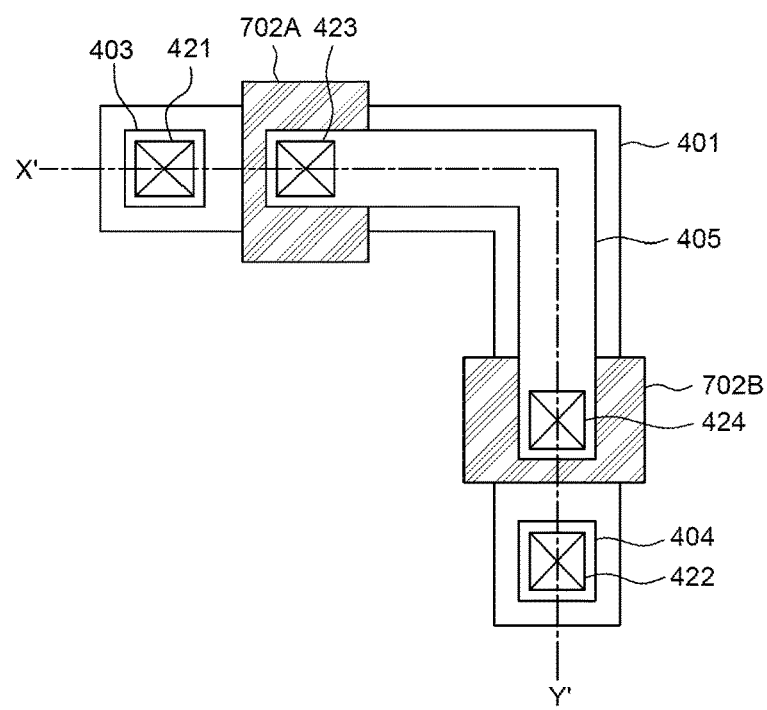
FIG. 3D is a plan view of a dual gate transistor according to a fourth aspect of the present disclosure.

FIG. 3D is a plan view of a dual gate transistor according to a fourth aspect. In FIG. 3D, the connection unit CE is removed from the structure of the dual gate transistor according to the third aspect of FIG. 3C and a contact hole is formed above two gate electrodes 702A and 702B to short two gate electrodes 702A and 702B.

In detail, an active layer 401 is disposed on the substrate and two gate electrodes 702A and 702B are spaced apart from each other with a predetermined interval on the active layer 401 with an insulating layer therebetween to overlap the active layer 401. A third contact hole 423 and a fourth contact hole 424 are formed on two gate electrodes 702A and 702B to expose two gate electrodes 702A and 702B through the insulating layer which is disposed on two gate electrodes 702A and 702B. Simultaneously with the formation of the third contact hole 423 and the fourth contact hole 424, a first contact hole 421 and a second contact hole 422 are formed on both sides of two gate electrodes 702A and 702B, respectively to expose the active layer 401. And, the source electrode 403 and the drain electrode 404 are formed on the insulating layer. In this case, an auxiliary electrode 405 is formed such that two gate electrodes 702A and 702B are shorted from each other through the third contact hole 423 and the fourth contact hole 424. The source electrode 403, the drain electrode 404, and the auxiliary electrode 405 are simultaneously formed by the same process. The auxiliary electrode 405 may be formed in an area overlapping the active layer 401. The auxiliary electrode 405 is formed in the area of the active layer 401 to overlap the active layer 401 so that an area occupied by the dual gate transistor may be reduced. In detail, the area may be reduced as much as an area occupied by the connection unit CE, so that it is effective to implement a high resolution display panel with a narrow bezel.

Figure 3E:
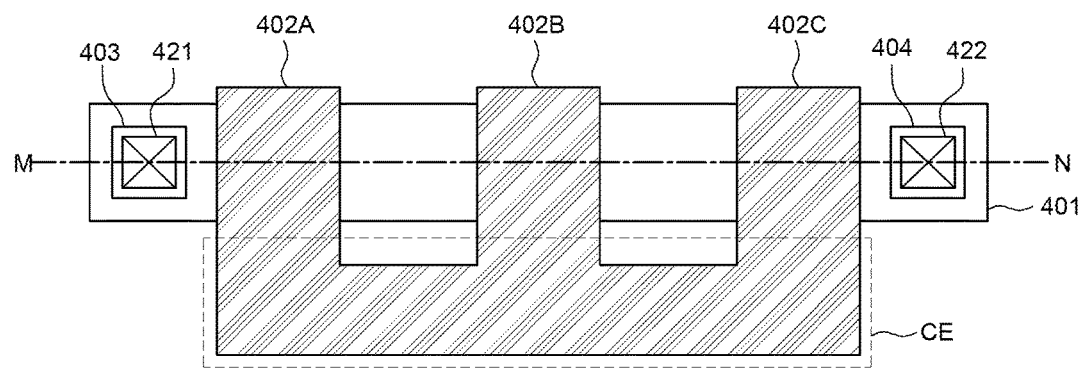
FIG. 3E is a plan view of a triple gate transistor according to a fifth aspect of the present disclosure.

FIG. 3E is a plan view of a triple gate transistor according to a fifth aspect of the present disclosure. In FIG. 3E, one transistor is further connected in series with the dual gate transistor according to the first aspect of FIG. 3A, so that an amount of current which may be leaked when one transistor is used may be reduced. In this case, gate electrodes of three transistors operate by the same signal.

An active layer 401 is disposed on a substrate and three gate electrodes 402A, 402B, and 402C are disposed on the active layer 401 with an insulating layer therebetween. Three gate electrodes 402A, 402B, and 402C may divided into a portion which overlaps the active layer 401 which is required to substantially operate three transistors and a connection unit CE which connects three gate electrodes 402A, 402B, and 402C to apply the same signal to three gate electrodes 402A, 402B, and 402C. In this case, shapes of three gate electrodes 402A, 402B, and 402C may have angular two U shapes as illustrated in FIG. 3E. However, the shapes are not limited thereto and may be two U shapes with no angles or an angular W shape.

A source electrode 403 and a drain electrode 404 are disposed on three gate electrodes 402A, 402B, and 402C with an insulating layer therebetween. The source electrode 403 and the drain electrode 404 are connected to the active layer 401 through a first contact hole 421 and a second contact hole 422, respectively. The source electrode 403 and the drain electrode 404 are disposed on both sides of three gate electrodes 402A, 402B, and 402C, respectively to form a serially-connected triple gate transistor. In this case, the positions of the source electrode 403 and the drain electrode 404 may be switched.

Figure 3F:
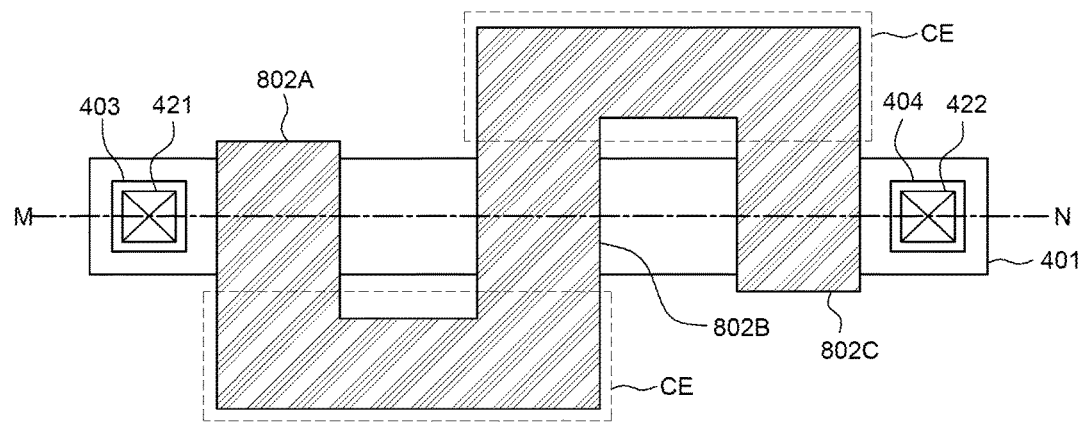
FIG. 3F is a plan view of a triple gate transistor according to a sixth aspect of the present disclosure.

FIG. 3F is a plan view of a triple gate transistor according to a sixth aspect of the present disclosure. FIG. 3F is a modification of FIG. 3E and a triple gate transistor may be implemented by configuring three gate electrodes 802A, 802B, and 802C and the connection unit CE such that two U shapes face to be opposite to each other.

An active layer 401 is disposed on a substrate and three gate electrodes 802A, 802B, and 802C are disposed on the active layer 401 with an insulating layer therebetween. Three gate electrodes 802A, 802B, and 802C may divided into a portion which overlaps the active layer 401 required to substantially operate three transistors and a connection unit CE which connects three gate electrodes 802A, 802B, and 802C to apply the same signal to three gate electrodes 802A, 802B, and 802C. In this case, the shapes of three gate electrodes 802A, 802B, and 802C and the connection unit CE may have a shape in which two angular U shapes face to be opposite to each other as illustrated in FIG. 3F, but are not limited thereto and may have an S shape with no angle.

A source electrode 403 and a drain electrode 404 are disposed on three gate electrodes 802A, 802B, and 802C with an insulating layer therebetween. The source electrode 403 and the drain electrode 404 are connected to the active layer 401 through a first contact hole 421 and a second contact hole 422, respectively. The source electrode 403 and the drain electrode 404 are disposed on both sides of three gate electrodes 802A, 802B, and 802C, respectively to form a serially-connected triple gate transistor. In this case, the positions of the source electrode 403 and the drain electrode 404 may be switched.

Figure 3G:
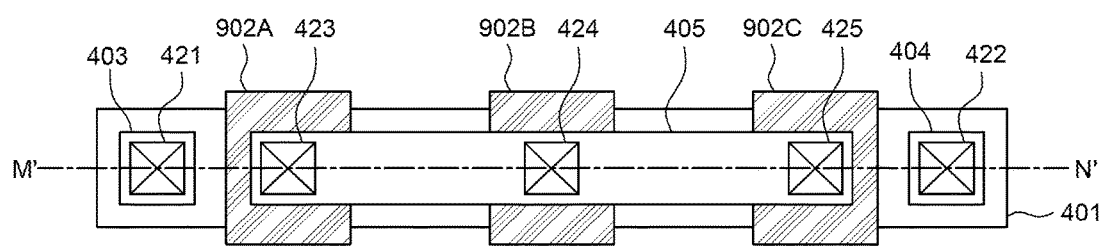
FIG. 3G is a plan view of a triple gate transistor according to a seventh aspect of the present disclosure.

FIG. 3G is a plan view of a triple gate transistor according to a seventh aspect of the present disclosure. In FIG. 3G, a connection unit CE is removed from a structure of the triple gate transistor according to the fifth aspect of FIG. 3E and the sixth aspect of FIG. 3F and a contact hole is formed above three gate electrodes 902A, 902B, and 902C to short three gate electrodes 902A, 902B, and 902C.

In detail, an active layer 401 is disposed on the substrate and three gate electrodes 902A, 902B, and 902C are spaced apart from each other with a predetermined interval on the active layer 401 with an insulating layer therebetween to overlap the active layer 401. A third contact hole 423, a fourth contact hole 424, and a fifth contact hole 425 are formed on three gate electrodes 902A, 902B, and 902C to expose three gate electrodes 902A, 902B, and 902C through the insulating layer which is disposed on three gate electrodes 902A, 902B, and 902C. Simultaneously with the formation of the third contact hole 423, the fourth contact hole 424, and the fifth contact hole 425, a first contact hole 421 and a second contact hole 422 are formed on both sides of three gate electrodes 902A, 902B, and 902C, respectively to expose the active layer 401. And, the source electrode 403 and the drain electrode 404 are formed on the insulating layer. In this case, an auxiliary electrode 405 is formed such that three gate electrodes 902A, 902B, and 902C are shorted from each other through the third contact hole 423, the fourth contact hole 424, and the fifth contact hole 425. The source electrode 403, the drain electrode 404, and the auxiliary electrode 405 are simultaneously formed by the same process. The auxiliary electrode 405 may be formed in an area overlapping the active layer 401 and three gate electrodes 902A, 902B, and 902C. The auxiliary electrode 405 is formed in the area of the active layer 401 to overlap the active layer 401 so that an area occupied by the triple gate transistor may be reduced. In detail, the area may be reduced as much as an area occupied by the connection unit CE, so that it is effective to implement a high resolution display panel with a narrow bezel.

The dual gate transistor and the triple gate transistor have been described through first to seventh aspects, but the present disclosure is not limited thereto, but one or more transistors may be further connected in series by the same method. This may be called a multiple gate transistor. The multiple gate transistor may refer to a thin film transistor including a structure in which two or more transistors are connected in series or a multiple gate structure.

Figure 4A:
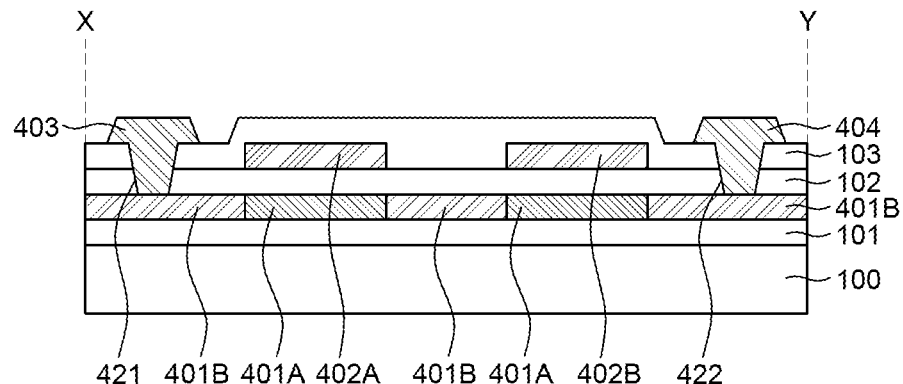
FIG. 4A is a cross-sectional view taken along line X-Y of FIGS. 3A and 3C.

FIG. 4A is a cross-sectional view taken along line X-Y of FIGS. 3A and 3C and is a cross-section view of a dual gate transistor disposed on a substrate 100. Description will be made representatively using reference numerals of FIG. 3A.

A buffer layer 101 may be formed on a substrate 100 and an active layer 401 may be formed on the buffer layer. The substrate 100 serves to support and protect various components of the display panel. The substrate 100 may be formed of an insulating material. For example, the substrate 100 may be a flexible substrate which is formed of a material having flexibility, such as a glass, polyimide, acryl, polyacrylate, polycarbonate, polyether, sulfonic acid based material, and silicon oxide (SiOx) material.

As mentioned above, even though the active layer 401 may be formed of any one of amorphous silicon (a-Si), polycrystalline silicon (p-Si), oxide silicon, and single crystal silicon (c-Si). In the aspects of FIGS. 4A to 4D, polycrystalline silicon (p-Si) will be described as an example. In order to form polycrystalline silicon (p-Si), amorphous silicon (a-Si) is deposited on the buffer layer 101 and then laser is irradiated thereon to crystalize the amorphous silicon.

The buffer layer 101 may be formed of silicon oxide (SiOx), silicon nitride (SiNx), or silicon oxy nitride (SiOxNx), but may be omitted. The buffer layer 101 is disposed between the substrate 100 and the active layer 401 to suppress current which flows through the active layer 401 at the time of operation from being leaked to the substrate 100 and impurities of the substrate 100 from being dispersed onto the active layer 401. And, heat generated by the laser which is irradiated to form the active layer 401 using polycrystalline silicon may also be blocked.

A first insulating layer 102 is formed on the crystalized active layer 401 and two gate electrodes 402A and 402B are formed on the first insulating layer 102. After forming two gate electrodes 402A and 402B, the active layer 401 is doped with ions in an area other than an area overlapping two gate electrodes 402A and 402B using two gate electrodes 402A and 402B as masks. P-type ions are doped in the P-type transistor and N-type ions are doped in the N-type transistor. For example, in the case of a P-type dual gate transistor, an area 401A which overlaps two gate electrodes 402A and 402B is crystalline silicon (p-Si) and an area which does not overlap two gate electrodes 402A and 402B is a P-type ion doping layer 401B. In this case, the area overlapping two gate electrodes 402A and 402B are also referred to as a channel layer 401A. Therefore, the active layer 401 is formed of a channel layer 401A and a P-type ion doping layer 401B which overlap two gate electrodes 402A and 402B. And, since the crystalline silicon p-Si has a larger leakage current than the amorphous silicon (a-Si), in order to solve a problem of leakage current, a lightly doped drain (LDD) structure may be used. That is, a doping concentration of a portion adjacent to the channel layer is locally reduced to suppress an electric field from being increased, thereby reducing a drain leakage current induced to two gate electrodes 402A and 402B.

A second insulating layer 103 is formed on two gate electrodes 402A and 402B. The first insulating layer 102 and the second insulating layer 103 may be silicon oxide (SiOx), silicon nitride (SiNx), or silicon oxy nitride (SiOxNx). A contact hole is formed on the first insulating layer 102 and the second insulating layer 103 such that the source electrode 403 and the drain electrode 404 are in contact with the active layer 401. In this case, a contact hole which allows the source electrode 403 to be in contact with the active layer 401 is a first contact hole 421 and a contact hole which allows the drain electrode 404 to be in contact with the active layer 401 is a second contact hole 422.

Therefore, the dual gate transistor formed as described above is disposed in a pixel driving circuit, a data driving circuit, or a gate driving circuit, to reduce leakage current of the transistor.

Figure 4B:
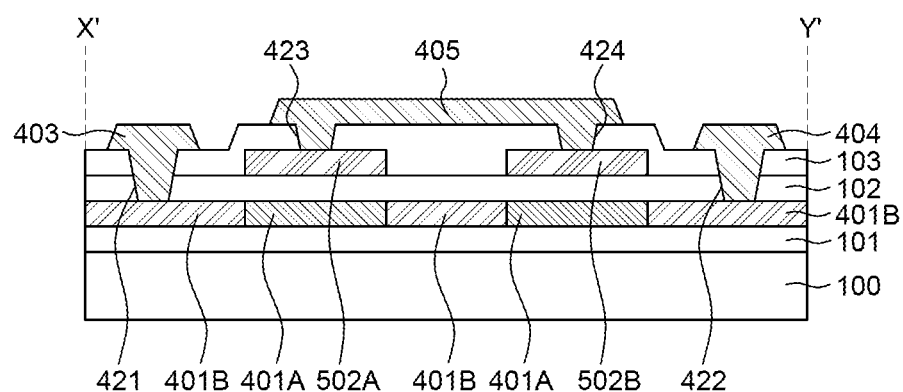
FIG. 4B is a cross-sectional view taken along line X'-Y' of FIGS. 3B and 3D.
Figure 4C:
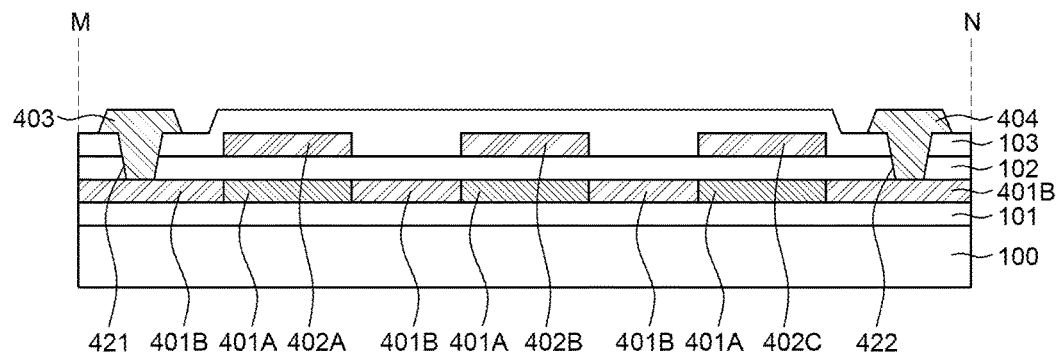
FIG. 4C is a cross-sectional view taken along line M-N of FIGS. 3E and 3F.
Figure 4D:
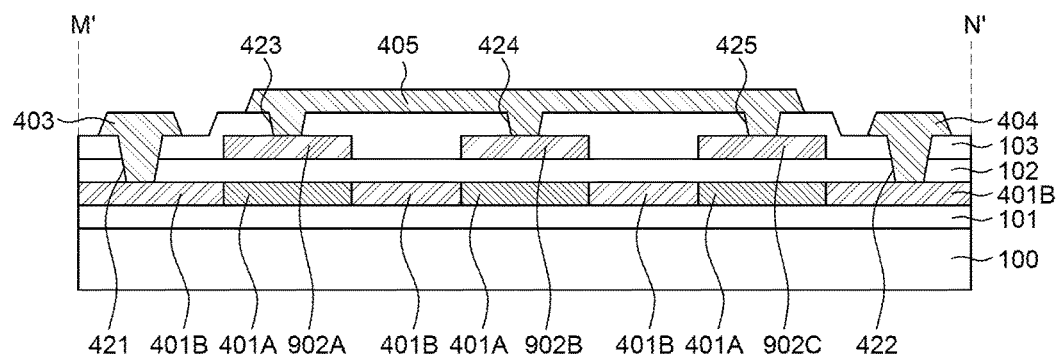
FIG. 4D is a cross-sectional view taken along line M'-N' of FIG. 3G.

Since the materials of the substrate 100, the buffer layer 101, the first insulating layer 102, and the second insulating layer 103 described in FIG. 4A are similarly applied to FIGS. 4B, 4C, and 4D, description of the materials may be omitted or the materials may be briefly described.

FIG. 4B is a cross-sectional view taken along line X'-Y' of FIGS. 3B and 3D and is a cross-sectional view of a dual gate transistor with a structure in which the gate electrode is shorted through a contact hole. Description will be made representatively using reference numerals of FIG. 3B.

A buffer layer 101 is formed on a substrate 100 and an active layer 401 is formed on the buffer layer. Laser is irradiated onto an amorphous silicon (a-Si) film to crystalize the active layer 401 in order to convert the amorphous silicon (a-Si) into polycrystalline silicon (p-Si) after depositing the amorphous silicon (a-Si). In this case, the buffer layer 101 may be omitted.

A first insulating layer 102 is formed on the crystalized active layer 401 and two gate electrodes 502A and 502B are formed on the first insulating layer 102. After forming two gate electrodes 502A and 502B, the active layer 401 is doped with ions in an area other than an area overlapping two gate electrodes 502A and 502B using two gate electrodes 502A and 502B as masks. For example, in the case of a P-type dual gate transistor, a channel layer 401A is crystalline silicon (p-Si) and an area 402A other than the channel layer 401A is a P-type ion doping layer. In this case, in order to solve the problem of the leakage current of the crystalline silicon (p-Si), a lightly doped drain (LDD) structure may be used to reduce a drain leakage current induced to two gate electrodes 502A and 502B.

A second insulating layer 103 is formed on two gate electrodes 502A and 502B. A first contact hole 421 and a second contact hole 422 are formed on the first insulating layer 102 and the second insulating layer 103 such that the source electrode 403 and the drain electrode 404 are in contact with the active layer 401. And, in order to short two gate electrodes 502A and 502B, a third contact hole 423 and a fourth contact hole 424 are formed on the second insulating layer 103 to expose upper portions of two gate electrodes 502A and 502B. The first contact hole 421, the second contact hole 422, the third contact hole 423, and the fourth contact hole 424 are formed by the same process and a half-tone mask may be used for the contact hole forming process. The half-tone mask is a mask with different light quantities and is configured by a transmitting unit, a half-transmitting unit, and a shielding unit.

After forming the contact holes, the source electrode 403, the drain electrode 404, and the auxiliary electrode 405 are formed such that the source electrode 403 and the drain electrode 404 are contact with the active layer 401 through the first contact hole 421 and the second contact hole 422. The auxiliary electrode 405 connects two gate electrodes 502A and 502B through third contact hole 423 and the fourth contact hole 424 to short two gate electrodes 502A and 502B. Therefore, the same signal is applied to two gate electrodes 502A and 502B. In this case, the auxiliary electrode 405 may be formed of the same material as the source electrode 403 and the drain electrode 404 so that an additional process may not be performed.

Accordingly, the dual gate transistor formed as described above is disposed in a pixel driving circuit, a data driving circuit, or a gate driving circuit to reduce an area of the dual gate transistor and implement a high resolution display panel with a narrow bezel.

FIG. 4C is a cross-sectional view taken along line M-N of FIGS. 3E and 3F and is a cross-sectional view of a triple gate transistor disposed on the substrate 100. Description will be made representatively using reference numerals of FIG. 3E.

In FIG. 4C, a gate electrode 402 is added between the source electrode 203 and the drain electrode 404 in a lamination structure of FIG. 4A so that three gate electrodes 402A, 402B, and 402C and three channel layers 401A are formed. Therefore, description of the same components as those in FIG. 4A may be omitted or the same components may be briefly described.

A buffer layer 101 may be formed on a substrate 100 and an active layer 401 may be formed on the buffer layer. The substrate 100 serves to support and protect various components of the display panel.

A first insulating layer 102 is formed on the active layer 401 and three gate electrodes 402A, 402B, and 402C are formed on the first insulating layer 102. After forming three gate electrodes 402A, 402B, and 402C, the active layer 401 is doped with ions in an area other than an area overlapping three gate electrodes 402A, 402B, and 402C using three gate electrodes 402A, 402B, and 402C as masks. For example, in the case of a P-type triple gate transistor, an area 401A which overlaps three gate electrodes 402A, 402B, and 402C is crystalline silicon (p-Si) and an area which does not overlap three gate electrodes 402A, 402B, and 402C is a P-type ion doping layer 401B. In this case, the area overlapping three gate electrodes 402A, 402B, and 402C are also referred to as a channel layer 401A. Therefore, the active layer 401 is formed of a channel layer 401A and a P-type ion doping layer 401B which overlaps three gate electrodes 402A, 402B, and 402C. And, since the crystalline silicon p-Si has a larger leakage current than the amorphous silicon (a-Si), in order to solve a problem of leakage current, a lightly doped drain (LDD) structure may be used. That is, a doping concentration of a portion adjacent to the channel layer is locally reduced to suppress an electric field from being increased, thereby reducing a drain leakage current induced to three gate electrodes 402A, 402B, and 402C.

A second insulating layer 103 is formed on three gate electrodes 402A, 402B, and 402C. A contact hole is formed on the first insulating layer 102 and the second insulating layer 103 such that the source electrode 403 and the drain electrode 404 are in contact with the active layer 401. In this case, a contact hole which allows the source electrode 403 to be in contact with the active layer 401 is a first contact hole 421 and a contact hole which allows the drain electrode 404 to be in contact with the active layer 401 is a second contact hole 422.

Therefore, the triple gate transistor formed as described above is disposed in a pixel driving circuit, a data driving circuit, or a gate driving circuit, to reduce leakage current of the transistor.

FIG. 4D is a cross-sectional view taken along line M'-N' of FIG. 3G and is a cross-sectional view of a triple gate transistor disposed on the substrate 100. In FIG. 4D, a gate electrode 402 is added between the source electrode 203 and the drain electrode 404 in a lamination structure of FIG. 4B so that three gate electrodes 902A, 902B, and 902C and three channel layers 401A are formed. Therefore, description of the same components as those in FIG. 4B may be omitted or the same components may be briefly described.

And, in order to short three gate electrodes 902A, 902B, and 902C, a third contact hole 423, a fourth contact hole 424, and a fifth contact hole 425 are formed on the second insulating layer 103 to expose upper portions of three gate electrodes 902A, 902B, and 902C. The first contact hole 421, the second contact hole 422, the third contact hole 423, the fourth contact hole 424, and the fifth contact hole 425 are formed by the same process.

After forming the contact holes, the source electrode 403, the drain electrode 404, and the auxiliary electrode 405 are formed to be in contact with the active layer 401 through the first contact hole 421 and the second contact hole 422. The auxiliary electrode 405 connects three gate electrodes 902A, 902B, and 902C through third contact hole 423, the fourth contact hole 424, and the fifth contact hole 425 to short three gate electrodes 902A, 902B, and 902C. Therefore, the same signal is applied to three gate electrodes 902A, 902B, and 902C. In this case, the auxiliary electrode 405 may be formed of the same material as the source electrode 403 and the drain electrode 404 so that an additional process may not be performed.

Accordingly, the triple gate transistor formed as described above is disposed in a pixel driving circuit, a data driving circuit, or a gate driving circuit to reduce an area of the triple gate transistor and implement a high resolution display panel with a narrow bezel.

Figure 5A:
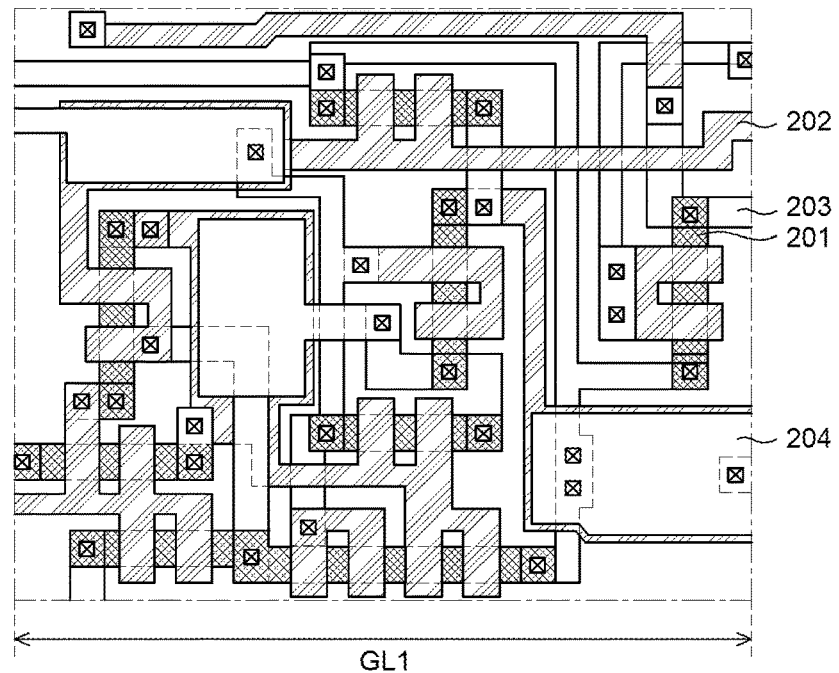
FIG. 5A is a view illustrating a part of a driving circuit according to a first aspect which is applied to a gate driving circuit of FIG. 1.

FIG. 5A is a view illustrating a part of a driving circuit according to a first aspect which is applied to a gate driving circuit of FIG. 1.

Since a gate driving circuit needs to sequentially input signals to a gate electrode which is connected to every pixel row, the gate driving circuit may be configured by circuits such as a shift register, an inverter, and a buffer. For example, according to the first aspect of FIG. 3A and the second aspect of FIG. 3B, the gate driving circuit may include a scan driver and an emission driver. The scan driver transmits a signal to a first scan line SCAN1 and a second scan line SCAN2 and the emission driver transmits a signal to an emission line EM.

FIG. 5A illustrates a part of the emission driver and nine dual gate transistors according to the first aspect are disposed. In this case, a length in a horizontal axis occupied by an illustrated circuit is denoted by GL1. Even though transistors with the same size are implemented, a dual gate transistor having two gates is more stable than the single gate transistor. Therefore, a plurality of dual gate transistors is disposed to secure uniformity of device performance.

Each dual gate transistor includes an active layer 201, a gate electrode 202, and a first source-drain electrode 203. The first source-drain electrode 203 is used to form a source electrode and a drain electrode of the dual gate transistor. The active layer 201 and the gate electrode 202 are formed by the same process using the same material as the active layer 401 and the gate electrode 402 formed in the pixel driving circuit. A second source-drain electrode 204 illustrated in the drawing is formed on the first source-drain electrode 203, connects the gate electrode 202 or the first source-drain electrode 203 if necessary, or forms one electrode of the capacitor.

Similar to the first aspect, the gate electrode 202 includes a portion overlapping the active layer 201 and a connection unit which connects two gate electrodes to apply the same signal to two gate electrodes. Two gate electrodes and the connection unit may be formed by the same layer and the same process.

Figure 5B:
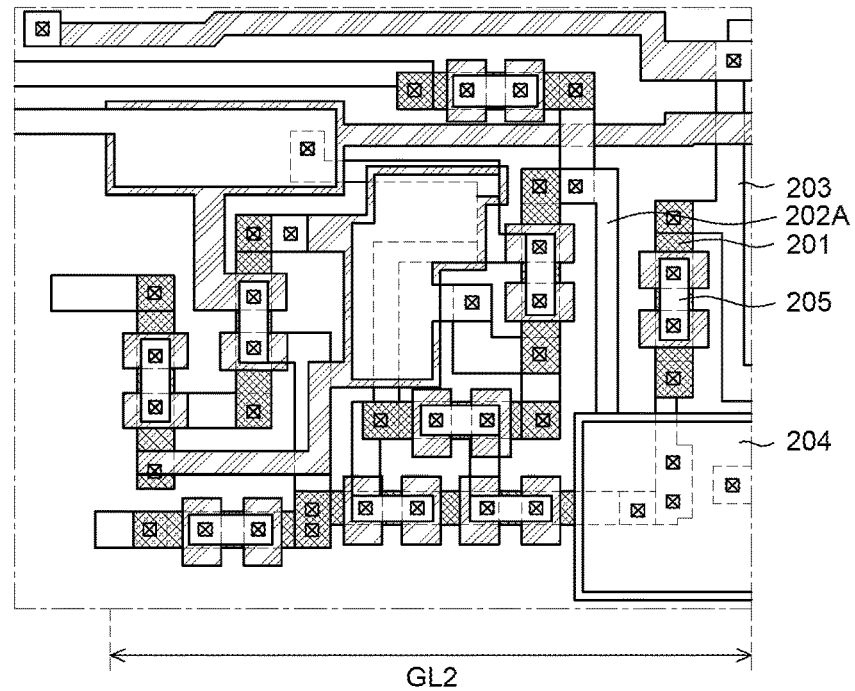
FIG. 5B is a view illustrating a part of a driving circuit according to a second aspect which is applied to a gate driving circuit of FIG. 1.

FIG. 5B is a view illustrating a part of a driving circuit according to a second aspect which is applied to a gate driving circuit of FIG. 1 and is a part of an emission driver, similarly to FIG. 5A. The emission drivers illustrated in FIGS. 5A and 5B are partially same, but the structure of the dual gate transistor is different.

In order to implement nine dual gate transistors, each dual gate transistor includes an active layer 201, a gate electrode 202A, a first source-drain electrode 203, and an auxiliary electrode 205. The first source-drain electrode 203 is used to form a source electrode, a drain electrode, and an auxiliary electrode 205 of the dual gate transistor. The active layer 201 and the gate electrode 202A are formed by the same process using the same material as the active layer 201 and the gate electrode 202A formed on each pixel driving circuit. The first source-drain electrode 203 and the auxiliary electrode 205 are formed by the same process using the same material as the source electrode 403, the drain electrode 404, and the auxiliary electrode 405 formed on each pixel driving circuit. As mentioned above, the second source-drain electrode 204 is formed on the first source-drain electrode 203, connects the gate electrode 202A or the first source-drain electrode 203 if necessary, or forms a capacitor.

In the dual gate transistor, a connection unit included in two gate electrodes 202A of FIG. 5A is removed and an auxiliary electrode 205 which shorts two gate electrodes 202A through a contact hole formed on two gate electrodes 202A is formed. The auxiliary electrode 205 is disposed to overlap the active layer 201 so that an area occupied by the dual gate transistor of FIG. 5B may be configured to be smaller than an area occupied by the dual gate transistor of FIG. 5A. In this case, when the auxiliary electrode 205 overlaps the active layer 201, substantially, the auxiliary electrode may overlap the active layer in an area where the active layer 201 is formed.

That is, a connection unit of two gate electrodes of the dual gate electrode is omitted and the auxiliary electrode 205 is formed so that a length of a horizontal axis occupied by the gate driving circuit including nine dual gate transistors is GL2, which is reduced by GL1. The area may be reduced by approximately nine times the area occupied by the connection unit of the gate electrode.

The aspects of the present disclosure can also be described as follows:

According to an aspect of the present disclosure, a display panel includes a substrate including a pixel area and a non-pixel area, and a dual gate transistor on the non-pixel area, in which the dual gate transistor includes first and second transistors which are connected in series, and an auxiliary electrode which connects two gate electrodes of the first and second transistors, and the auxiliary electrode is on a different layer from the gate electrode.

The dual gate transistor may include an active layer on the substrate, the two gate electrodes which are on the active layer to be spaced apart from each other, and an insulating layer disposed on the two gate electrodes connected through a contact hole in the insulating layer.

The dual gate transistor may include a source electrode and a drain electrode on the insulating layer, and the source electrode, the drain electrode, and the auxiliary electrode may be formed of the same material.

The auxiliary electrode may be within an area where the active layer is disposed.

The active layer may be formed of polycrystalline silicon.

The dual gate transistor may constitute a gate driver disposed in the non-pixel area.

The display panel may further include a third gate transistor in which one transistor is further connected to the dual gate transistor in series.

According to an another aspect of the present disclosure, a display panel includes a flexible substrate, and a plurality of transistors on the flexible substrate, in which the plurality of transistors includes a multiple gate transistor in which at least two transistors are connected in series, and the multiple gate transistor has a plurality of gate electrodes connected to each other through a contact hole in an insulating layer disposed on the gate electrodes.

The number of contact holes may be equal to or larger than the number of the multiple gate transistors.

The display panel may further include an auxiliary electrode on the insulating layer.

The auxiliary electrode may be in contact with the gate electrode through the contact hole.

The auxiliary electrode may overlap the gate electrode and may be disposed in an area where the gate electrode is formed.

The multiple gate transistor may include a top-gate structure.

The multiple gate transistor may include an active layer formed of polycrystalline silicon.

According to an yet another aspect of the present disclosure, a thin film transistor includes an active layer on a substrate and having two channel layers which are spaced apart from each other, a first insulating layer on the active layer, two gate electrodes which are spaced apart from each other on the first insulating layer to form a dual gate structure, and a source electrode and a drain electrode which are on the active layer with the active layer therebetween and are electrically connected to the active layer through a contact hole on the first insulating layer, in which the two gate electrodes are electrically connected to each other through a connection structure disposed on a different layer from the two gate electrode.

The thin film transistor may further include a second insulating layer on the first insulating layer, in which the connection structure is on the second insulating layer to electrically connect two gate electrodes through a contact hole in the second insulating layer.

The thin film transistors connected through the connection structure may have a smaller area than that of a thin film transistor having a dual gate structure in which two gate electrodes are electrically connected to each other on the same layer.

The connection structure of the thin film transistor may be on the same layer as the source electrode and the drain electrode.

The connection structure of the thin film transistor may be disposed within an area where the active layer is formed.

Although the aspects of the present disclosure have been described in detail with reference to the accompanying drawings, the present disclosure is not limited thereto and may be embodied in many different forms without departing from the technical concept of the present disclosure. Therefore, the aspects of the present disclosure are provided for illustrative purposes only but not intended to limit the technical spirit of the present disclosure. The scope of the technical spirit of the present disclosure is not limited thereto. Therefore, it should be understood that the above-described aspects are illustrative in all aspects and do not limit the present disclosure. The protection scope of the present disclosure should be interpreted based on the following appended claims and it should be appreciated that all technical spirits included within a range equivalent thereto are included in the protection scope of the present disclosure.

What is claimed is:

1. A display panel, comprising:
   a substrate divided into a display area and a non-display area; and
   a dual gate transistor on the substrate,
   wherein the dual gate transistor includes first and second transistors which are connected in series, and an auxiliary electrode which connects two gate electrodes of the first and second transistors, and the auxiliary electrode is on a different layer from the gate electrode.

2. The display panel according to claim 1, wherein the dual gate transistor includes:
   an active layer on the substrate,
   the two gate electrodes which are on the active layer to be spaced apart from each other; and
   an insulating layer disposed on the two gate electrodes connected through a contact hole in the insulating layer.

3. The display panel according to claim 2, wherein the dual gate transistor includes a source electrode and a drain electrode on the insulating layer, and
   the source electrode, the drain electrode, and the auxiliary electrode are formed of the same material.

4. The display panel according to claim 1, wherein the auxiliary electrode is within an area where the active layer is disposed.

5. The display panel according to claim 1, wherein the active layer is formed of polycrystalline silicon.

6. The display panel according to claim 1, wherein the dual gate transistor constitutes a gate driver disposed in the non-display area.

7. The display panel according to claim 1, further comprising:
   a third gate transistor in which one transistor is further connected to the dual gate transistor in series.

8. A display panel, comprising:
   a flexible substrate; and
   a plurality of transistors on the flexible substrate,
   wherein the plurality of transistors include a multiple gate transistor in which at least two transistors are connected in series, and the multiple gate transistor has a plurality of gate electrodes connected to each other through a contact hole in an insulating layer disposed on the gate electrodes.

9. The display panel according to claim 8, wherein the number of contact holes is equal to or larger than the number of the multiple gate transistor.

10. The display panel according to claim 8, further comprising an auxiliary electrode on the insulating layer.

11. The display panel according to claim 10, wherein the auxiliary electrode is in contact with the gate electrode through the contact hole.

12. The display panel according to claim 10, wherein the auxiliary electrode overlaps the gate electrode and is disposed in an area where the gate electrode is formed.

13. The display panel according to claim 8, wherein the multiple gate transistor includes a top-gate structure.

14. The display panel according to claim 13, wherein the multiple gate transistor includes an active layer formed of polycrystalline silicon.

15. A thin film transistor, comprising:
   an active layer on a substrate and having two channel layers which are spaced apart from each other;
   a first insulating layer on the active layer;

two gate electrodes which are spaced apart from each other on the first insulating layer to form a dual gate structure; and a source electrode and a drain electrode which are on the active layer with the active layer therebetween and are electrically connected to the active layer through a contact hole in the first insulating layer, wherein the two gate electrodes are electrically connected to each other through a connection structure disposed on a different layer from the two gate electrodes.

16. The thin film transistor according to claim 15, further comprising:

a second insulating layer on the first insulating layer, wherein the connection structure is on the second insulating layer to electrically connect two gate electrodes through a contact hole in the second insulating layer.

17. The thin film transistor according to claim 16, wherein the thin film transistors connected through the connection structure have a smaller area than that of a thin film transistor having a dual gate structure in which two gate electrodes are electrically connected to each other on the same layer.

18. The thin film transistor according to claim 15, wherein the connection structure is on the same layer as the source electrode and the drain electrode.

19. The thin film transistor according to claim 15, wherein the connection structure is disposed within an area where the active layer is formed.

20. The thin film transistor according to claim 15, wherein the active layer is formed of polycrystalline silicon.

* * * * *